United States Patent [19]
Woith et al.

[11] Patent Number: 5,600,256
[45] Date of Patent: Feb. 4, 1997

[54] CAST ELASTOMER/MEMBRANE TEST PROBE ASSEMBLY

[75] Inventors: Blake F. Woith, Orange; John Pasiecznik, Jr., Malibu; William R. Crumly, Anaheim; Robert K. Betz, Long Beach, all of Calif.

[73] Assignee: Hughes Electronics, Los Angeles, Calif.

[21] Appl. No.: 387,674

[22] Filed: Feb. 13, 1995

Related U.S. Application Data

[62] Division of Ser. No. 88,962, Jul. 1, 1993, Pat. No. 5,412,866.

[51] Int. Cl.$^6$ .................................................. G01R 31/02
[52] U.S. Cl. ............................................ 324/754; 324/757
[58] Field of Search ...................................... 324/754, 758, 324/755, 757; 216/18

[56] References Cited

U.S. PATENT DOCUMENTS

| | | | |
|---|---|---|---|
| 4,906,920 | 3/1990 | Huff et al. | 324/754 |
| 4,912,399 | 3/1990 | Greub et al. | 324/754 |
| 4,975,638 | 12/1990 | Evans et al. | 324/754 |
| 4,980,637 | 12/1990 | Huff et al. | 324/758 |
| 5,148,103 | 9/1992 | Pasieznik, Jr. | 324/758 |
| 5,180,977 | 1/1993 | Huff | 324/754 |
| 5,225,037 | 7/1993 | Elder et al. | 216/18 |
| 5,264,787 | 11/1993 | Woith et al. | 324/758 |
| 5,382,898 | 1/1995 | Subramanian | 324/754 |

*Primary Examiner*—Ernest F. Karlsen
*Assistant Examiner*—Russell M. Kobert
*Attorney, Agent, or Firm*—Elizabeth E. Leitereg; Terje Gudmestad; Wanda K. Denson-Low

[57] ABSTRACT

A flexible membrane (12) of an integrated circuit chip test probe is provided with raised contact features (14) on one side arranged in the pattern of contact pads of the chip to be tested. During manufacture, the membrane, in the area of its raised contact features, is specifically shaped by applying a vacuum to the outside of the membrane and casting a solid resilient elastomer (26) in place on the other side of the membrane to act as a shape retaining solid backup and to provide an anti-drape (226) shaped membrane (212) or to ensure planarity (326) of the ends of the membrane contact features (314). The vacuum may be used to pull the membrane and its contacts against a shape defining mandrel (60, 260, 360) while the elastomer is cast into place.

4 Claims, 3 Drawing Sheets

5,600,256

CAST ELASTOMER/MEMBRANE TEST PROBE ASSEMBLY

This is a division of application Ser. No. 08/088,962 filed Jul. 1, 1993, now U.S. Pat. No. 5,412,866.

BACKGROUND OF THE INVENTION

1. Field of the Invention

This invention relates to the testing of integrated circuits or other items having a pattern of contacts thereon, and more particularly concerns a pre-shaped test probe membrane.

2. Description of Related Art

Integrated circuit chips are manufactured with large numbers of identical circuits on a single wafer which ultimately are separately cut from the wafer for use. It is desirable to test each circuit individually to determine whether or not it functions as intended before separating it from the wafer. Additional testing of separated circuits may be desired at various stages in assembly of the circuit in the finished apparatus. Additional testing may be accomplished after packaging a circuit, after placing it in a multi-chip module and after disassembly of a multi-chip module to identify inoperable circuits.

Conventional testing employs a probe card which is provided with a large number of small tungsten blades or needles that are mechanically and electrically connected to a circuit board and act as contacts. Electrical leads extend from the contacts to the outer edge of the board for connecting the probe card to test circuitry. In use the blades or needles are moved into engagement with the pads of an integrated circuit. The motion has to be such that there is a slight scrubbing action that is required for breaking through the oxidation coating that often covers an aluminum integrated circuit chip pad. Thus the blades or needles are frequently positioned at an angle so that they will effectively slide along or scrub a surface of the pad to break the oxide coating. This provides an electrical connection so that signals can be read to determine integrity of the circuit on the chip.

Ends of the needles or blades must all fall in the same plane in order to assure that each one makes electrical contact with a pad of the integrated circuit. This is accomplished by bending the blades or needles after they are mounted on the probe card, which is laborious, time consuming and expensive. Even after such adjustment the blades or needles tend to creep back toward their original position so that their adjusted locations are lost. This loss of adjustment also comes about from the pressure of the needles against the chips, aggravated by the scrubbing action used to assure penetration of the oxide coating. As a result, constant maintenance is necessary or the probe cards will not perform their intended function. Even when in proper adjustment the needles cannot compensate for significant differences in the heights of the contact pads on the integrated circuit chips being tested. The needles also may apply excessive forces against the chip so as to damage the chips. The close spacing necessary for testing some chips cannot be achieved with conventional needle contacts.

Improved testing arrangements are disclosed in a co-pending application Ser. No. 606,676 filed Oct. 31, 1991 by John Pasiecznik, Jr. for Method and Apparatus for Testing Integrated Circuits, and in a co-pending application Ser. No. 07/752,422, filed Aug. 30, 1991 by Blake F. Woith and William R. Crumly for Rigid Flex Circuits With Raised Features as IC Test Probes. Both of these applications are assigned to the same assignee as that of this application, and both are incorporated herein by reference as though fully set forth. In the above-identified application of John Pasiecznik, Jr. a flexible membrane is provided with raised features on one side which connect through circuit traces to a probe card that in turn is connected to the test circuit. During testing use of the probe pressure deflects the membrane to ensure that the contacts of the membrane are pressed against the pads of an integrated circuit to provide an electrical connection.

In the above-identified application of Woith and Crumly a separate pliable soft pad or block of a transparent elastomer is mechanically secured to the membrane to cause part of the membrane to be distended for applying a force between the membrane contacts and the pads of the integrated circuit chip. There is room for improvement, however, in the arrangements of each of these prior applications for assuring that adequate pressure exists between the contacts on the membrane and the pads on the integrated circuit chip to assure good electrical connection, while at the same time avoiding undesirable contact between remaining portions of the membrane and the chip that may be caused by "drape" of the membrane. Additional improvement may be desired in the use of backup devices for shaping the membrane and in the costs of manufacture and use of such backup devices. Although the arrangement of the application of Woith and Crumly improves on the earlier application of John Pasiecznik, Jr. in certain respects, still further improvement is desired in the requirement for use of specially shaped backup members.

SUMMARY OF THE INVENTION

In carrying out principles of the present invention in accordance with a preferred embodiment thereof, a flexible membrane probe having test contacts on one side is deformed during fabrication to produce a desired membrane shape, and while so deformed a pliable soft pad of transparent resilient material is cast in place on and fixed to the membrane. This provides a permanent predefined membrane shape that is, nevertheless, sufficiently deformable to ensure good electrical contact. According to a feature of this invention, shape of the cast transparent backup elastomer is precisely defined during fabrication of the probe by pressing the membrane against a mandrel of predetermined shape while the transparent elastomer is cast in place. To preform the membrane for casting the elastomer, there is employed a fixture for holding the membrane across a vacuum chamber which mounts an adjustably positionable mandrel. A vacuum drawn in the chamber pulls a section of the membrane against the pre-shaped mandrel surface, where it is held while the pliable soft layer of transparent elastomer is cast in place on the other side of the membrane. A thin, rigid transparent member, such as a glass plate, may be secured to the rigid substrate to which the flexible membrane edges are affixed to support the thin cast elastomer and help retain membrane shape. According to another aspect of the invention, the probe incorporates a pre-shaped membrane assembly that has a thin flexible contact bearing membrane having a predetermined non-planar configuration, such as, for example, bowed outwardly in its central area, and a thin layered elastomer secured to and in direct contact with one side of the membrane over at least the central area of the membrane, whereby the elastomer maintains the non-planar configuration of the membrane and concomitantly allows membrane portions to deflect upon contact with pads of a chip to be tested.

DESCRIPTION OF THE PREFERRED EMBODIMENTS

Figure 1:
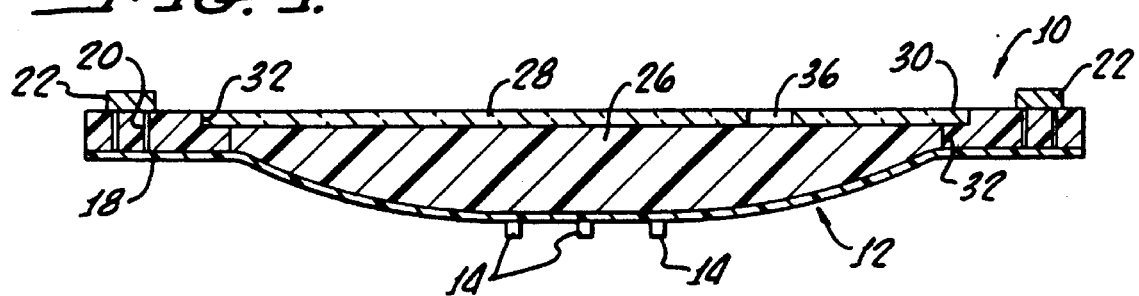
FIG. 1 is a sectional view of a pre-shaped membrane embodying principles of the present invention.
Figure 2:
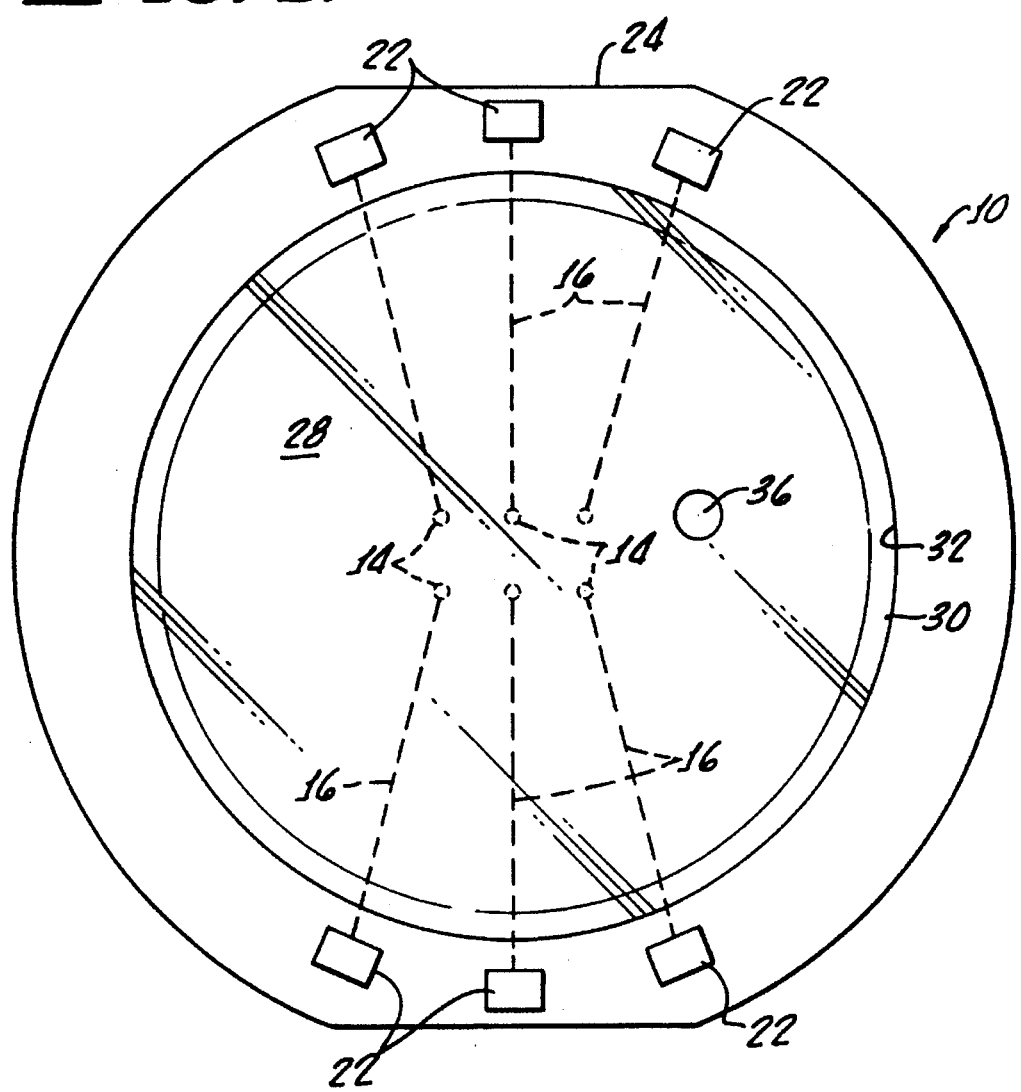
FIG. 2 is a plan view of the membrane of FIG. 1.

An exemplary membrane probe assembly or probe card embodying principles of the present invention is illustrated in FIG. 1 as comprising a rigid annular substrate 10 formed of a suitable dielectric material, such as a photoceramic material, a polyimide or a phenolic resin. Secured to substrate 10, as by an adhesive or other suitable means, is a thin, flexible transparent membrane 12, upon the lower surface of which (as viewed in the drawings) has been formed a plurality of probe test contacts 14 that are electrically connected with conductors 16 (as illustrated by dashed lines in FIG. 2) formed on the side of the membrane that bears contacts 14. The conductors individually extend from one of the probe contacts radially outwardly to a peripheral portion 18 of the membrane where the individual conductors are connected by means of vias 20 extending through the substrate 10 to contact pads or elements 22 on the other side of the substrate 10. Also illustrated in FIG. 2, one or more flats 24 on the periphery of substrate 10 enables orientation of the probe in holding fixtures.

The probe card is arranged to be secured to a probe test fixture (not shown) which provides signal connections from test fixture circuitry to the individual ones of the probe contacts 14 via the conductors 16, vias 20 and contact pads 22. The probe card may be secured to a test fixture by the means and in the manner described in the above identified co-pending applications. When mounted in the test fixture the probe contacts will electrically connect to pads of a chip to be tested for transmission of signals to and from the chip pads.

Except for the curved configuration and elastomeric back-up layer, the arrangement described to this point may be identical to the membrane probe and contacts shown and described with particularity and further detail in each of the above-identified co-pending applications. In the prior applications the membrane 12, when not in use, has a planar configuration. When mounted in a test fixture it is positioned above a table carrying a wafer or integrated circuit chip to be tested. The membrane is moved to a position directly above and in alignment with the contact pads of the chip on the underlying table, and the probe contacts are visually aligned with the chip pads by visual observation through the transparent membrane. The chip is then raised to cause its pads to contact the membrane contacts. In the arrangement of one of the above mentioned patent applications, air under pressure is applied to the upper surface of the normally flat membrane, causing its central area to bow outwardly and thereby cause its contacts to be pressed into firm contact with the chip pads. In the arrangement of the other of the above-identified applications a transparent backup member in the form of a soft block of transparent elastomeric material is physically positioned on the upper side of the normally flat membrane and moved so as to press a particular portion of the flat membrane downwardly against the chip pads. In either case it is desirable to have the midsection of the membrane displaced outwardly so as to enhance contact between the chip pads and the membrane contacts. This is done to ensure that lack of planarity of chip pads or lack planarity of ends of the membrane contacts does not diminish desired contact with any of the chip pads. Frequently the chip, when it is raised, is moved first to a "touchdown" position wherein there is a first contact been a chip pad and a probe contact. Thereafter a small amount of "overdrive" or "over travel" is employed to raise the chip a small additional distance to ensure a suitable pressurized contact between the membrane contacts and the chip pads. This helps to penetrate any high resistivity oxide that may coat chip pads.

In accordance with a feature of the present invention, as incorporated in the embodiment illustrated in FIG. 1, no pressurized air is required to curve the membrane outwardly for improved contact with the chip pads. Nor is there needed any transparent backup block of predetermined configuration to physically press the central portion of the membrane and its contacts 14 outwardly against the chip pads. Instead, the membrane, although still flexible, is formed during manufacture with a predefined and predetermined curvature. This curvature of the stiff flexible membrane is fixed by a cast-in-place transparent and resiliently deformable elastomeric material 26. The resilient elastomer is cast to and against the upper surface (as seen in FIG. 1) of the membrane 12, as will be described with more particularity below. The transparent elastomer 26 may be any one of a number of soft, compliant, deformable, but solid body materials. It is self-adhesive and thereby adheres to the surface of the membrane against which it is molded. If deemed necessary or desirable the elastomer may be held in place by a thin, flat glass plate 28 that is fixedly secured, as by a suitable adhesive, at a peripheral edge 30 to a rebated portion 32 at the inner periphery of the annular substrate 10. The glass plate 28 may be applied after the elastomer is cast in place and may be provided with a hole 36 through which excess elastomer may be removed as the plate is applied. Alternatively, the hole 36 may be employed as a fill hole to inject the elastomer into the space between the membrane and the glass plate after the membrane has been properly shaped by application of a vacuum to its lower or outer surface.

Figure 3:
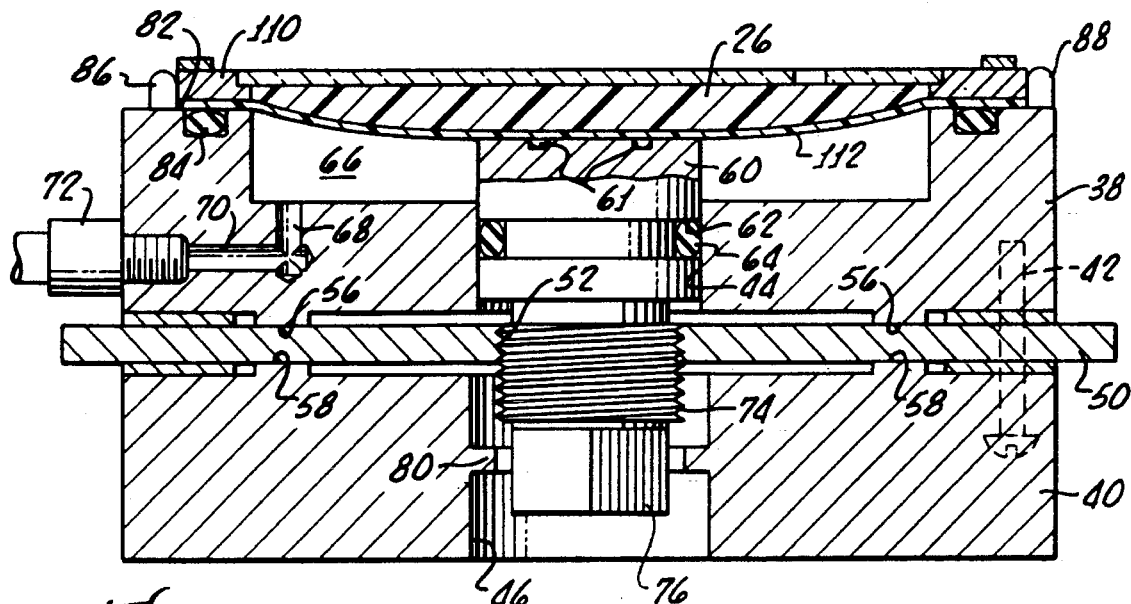
FIG. 3 is a sectional view of a fixture that may be employed for pre-shaping a test membrane while elastomer is cast thereon.

Schematically illustrated in FIG. 3 is a simplified example of a membrane shaping fixture that may be employed in fabrication of the probe to produce and hold a desired shape of the membrane by application of vacuum while the elastomer is applied and cured in place. A fixture housing is made in first and second sections 38,40 which are fixedly secured together, as by assembly screws 42, and which have axially directed mutually aligned central bores 44,46. The two sections are spaced apart by a distance sufficient to slidably receive a circular adjustment disc 50 positioned therebetween and having an interior aperture 52 that is internally threaded. The disc is rotatably mounted between the two housing sections on annular bearing surfaces 56,58 carried by the two housing sections.

Mounted within the bore of upper section 38 for rotatable and axially slidable motion is a mandrel 60 having a circumferential groove 62 in which is mounted a sealing O-ring 64 that cooperates with the interior of bore 44 to seal the fixture bore. The mandrel is a snug fit within the bore 44.

Upper housing section 38 is formed with an upwardly opening depression that defines a vacuum chamber 66 coupled by passages 68,70 to a vacuum fitting 72 that is adapted to be connected to a suitable source of vacuum (not shown). An externally threaded shaft 74 is fixedly secured to and extends downwardly from mandrel 60 into bore 46 of the lower section and bears a noncircular or rectangular end portion 76 that prevents rotation of the mandrel. The external threads of shaft 74 are threadedly engaged with the internal threads of the inner annular portion 52 of adjustor disc 50, whereby rotation of the latter will nonrotationally shift the mandrel axially of the housing bores.

The upper surface of upper housing section 38 provides an upwardly facing annular support table 82 carrying a peripheral sealing O-ring 84 and alignment pins 86,88.

The fixture shown in FIG. 3 is used for manufacture of a test membrane and casting a form defining elastomer on the membrane while it is so formed. In use of the shaping fixture to make a probe, a test membrane probe is placed on top of the upper housing section with the membrane peripheral portion and annular substrate 110 resting on fixture support table 82, as shown in FIG. 3. At this time the membrane is still flat. The peripheral outer edges of the membrane substrate contact alignment pins 86,88 and are aligned by such contact. Three or more circumferentially spaced alignment pins may be provided. It will be understood that initially, in its natural state, the flexible membrane 112 is planar, extending in a flat plane across the central opening of its annular substrate 110. With the membrane and its substrate in position on the upper section of the housing section 38, vacuum is drawn in the chamber 66 via the fitting 72 and passages 68,70 to draw a central portion of the flexible membrane downwardly toward the mandrel. The latter, at this time, is positioned at a lower portion of the vacuum chamber. Magnitude of the vacuum is adjusted to deflect the central portion of the membrane 112 until it attains an initial unrestrained curved configuration. It is not necessary to use the mandrel for certain desired configurations of the membrane. Thus, with the mandrel retracted to a lower portion of the vacuum chamber 66, where the mandrel will not contact the membrane when the latter is deflected downwardly by the vacuum in chamber 66, the membrane assumes a natural curved configuration, similar to that illustrated in FIG. 1, but without a central flattened portion. The amount of curvature depends upon the magnitude of the vacuum applied. With the membrane held in the desired curved configuration, the transparent elastomer, in liquid or semi-liquid uncured state, is applied to the upper surface of the membrane and allowed to cure in place while the applied vacuum is maintained and the upper glass plate 28 (see FIG. 1) is applied and secured to the membrane substrate. Alternatively, as mentioned above, the glass plate may be first secured to the membrane substrate and the elastomer cast in place by injection through hole 36 into the space between the membrane and the glass plate 28. As it cures the elastomer adhesively secures itself continuously over the entire area of its contact with the membrane. For clarity of the drawings thickness of the elastomer is exaggerated. In a typical example the elastomer may have a thickness at a central portion of about 0.06 inches.

A membrane, such as that illustrated in FIG. 1, is subject to "drape", particularly if it is large, with a large distance between contacts or rows of contacts. With such a large membrane, portions of the membrane between the contacts may deflect downwardly relative to the contacts and come undesirably close to or actually touch the surface of the chip when the chip supporting table is moved upwardly against the membrane and its contacts. Such a drape is to be avoided, and, accordingly, a final membrane configuration achieved by mandrel 60 of FIG. 3 may be employed. This mandrel is formed with a flat upper surface extending only over a central area of the membrane and with suitable contact receiving depressions 61 positioned in a pattern that mates with the pattern of conductive contacts on the underside of the membrane. With the vacuum applied to cause the membrane to assume a desired curvature, adjustor disc 50 is operated to raise the mandrel 60 until the mandrel touches the bottom of the membrane and the membrane contacts are received in mandrel depressions 61. Since the upper surface of the mandrel is flat, the central portion of the membrane in contact with the mandrel will itself be flat, although other portions of the membrane may be curved by the vacuum. With the curvature that is accomplished by the combined and cooperating action of the applied vacuum and the properly adjusted mandrel, the membrane now has the desired curvature shown in FIG. 3, and the elastomer may be cast in place. The casting of the elastomer on the curved membrane will ensure that the membrane retains the curvature that it has at the time that the elastomer is cast and cured.

Figure 4:
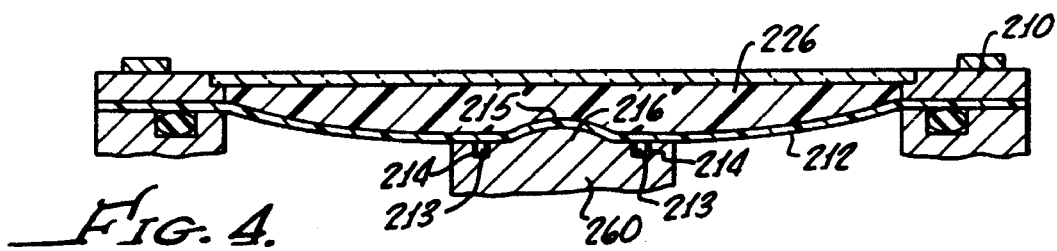
FIG. 4 illustrates a membrane and an anti-drape mandrel.

Although the mandrel illustrated in FIG. 3 may provide a membrane shape that provides some easing of the problem of membrane drape, a mandrel configuration such as that illustrated in FIG. 4 is preferred for avoiding drape of the membrane. Thus, as shown in FIG. 4, a mandrel 260 is employed with a membrane 212 having a rigid annular substrate 210 and contacts 214. In this case, in order to avoid drape, the mandrel has one or more raised sections 216 positioned between the recesses 213 that receive the contacts 214. Mandrel section 216 is raised above the plane of the remainder of the flat upper surface of the mandrel. Thus, as shown in FIG. 4, the mandrel surface between recesses 213 is raised slightly in a suitable configuration as indicated at 216 so that the membrane 212, which is still curved by application of vacuum in the fixture chamber 66, has an anti-drape recess 215 between contacts 214 that is raised above the remainder of the central portion of the outwardly curved membrane. As before, the elastomer 226 is cast in place on and adheres to the membrane. The latter is appropriately configured by the combination of actions of the vacuum and the mandrel and permanently assumes the shape illustrated in FIG. 4, including its permanent resilient transparent elastomer 226.

Figure 6:
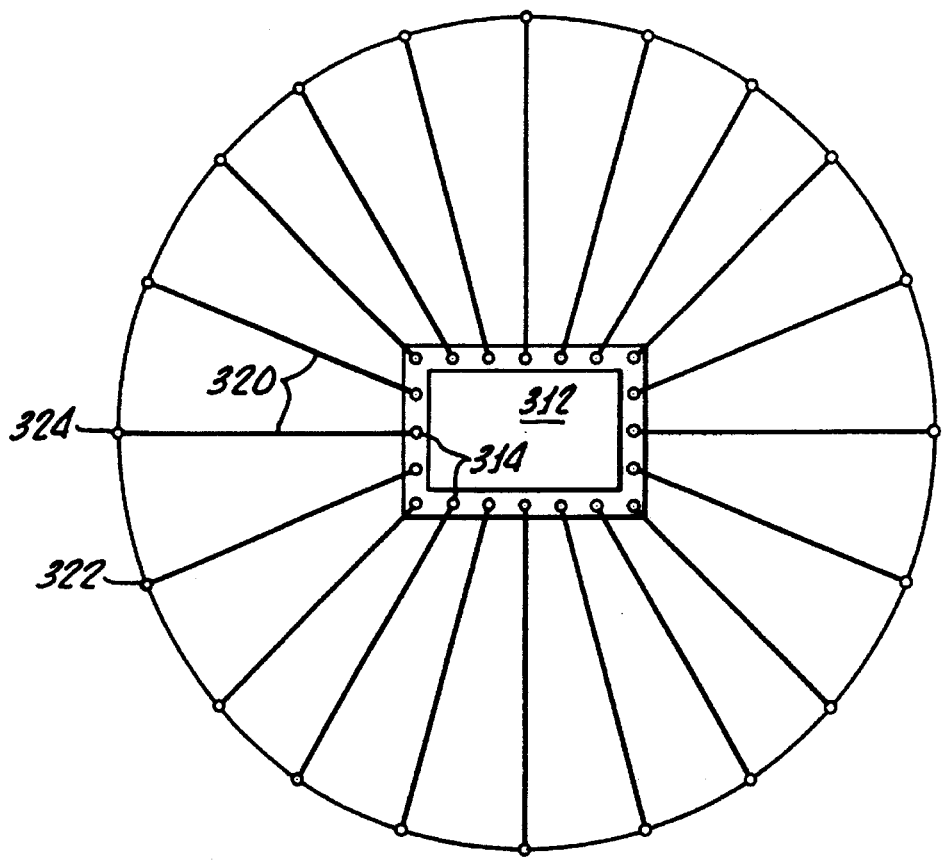
FIG. 6 is a schematic plan view of the arrangement of FIG. 5.
Figure 5:
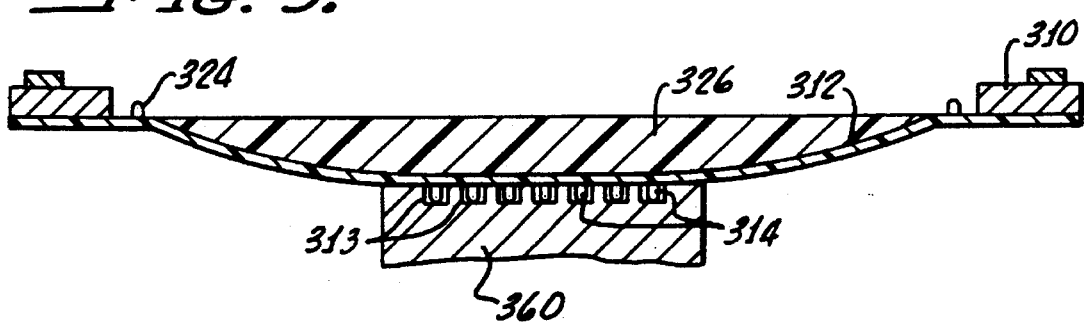
FIG. 5 illustrates an arrangement of membrane and mandrel wherein planarity of membrane contacts may be electrically monitored.

An additional problem that arises in connection with obtaining good contact between a number of membrane probe contacts and a number of chip pads is the fact that the probe contacts may be of different heights. The contacts and probe conductors are all formed on the under surface of the membrane by conventional electroforming processes which may be photolithographic or additive electroplating, all as described in the above-identified patent applications. In one method the membrane contacts 14 and 214 are formed as raised features or bumps on the ends of conductors that are electroplated on the surface of the membrane. These contacts, which are electroplated in place or otherwise formed on the membrane, may have different lengths, that is, they may project different distances from the membrane surface. It is desired to shape a membrane having contacts of different lengths so that the ends of all the contacts will lie in the same plane. To this end a mandrel 360, such as that shown in FIG. 5, is employed in the fixture of FIG. 3. Mandrel 360 has a plurality of contact recesses, indicated at 313 in FIG. 5, which receive contacts, indicated at 314, that are carried by membrane 312, which itself is mounted on a substrate 310. The mandrel in this case is made electrically conductive, and a suitable conductive lead (not shown) is connected thereto. Each of the contacts 314 of the probe membrane, as can be best seen in FIG. 6, is connected by a lead, such as one of leads 320, to one of a number of monitoring points 322,324, etc. on the periphery of the membrane. Preferably each contact is separately connected to a different one of the monitoring points.

Figure 7:
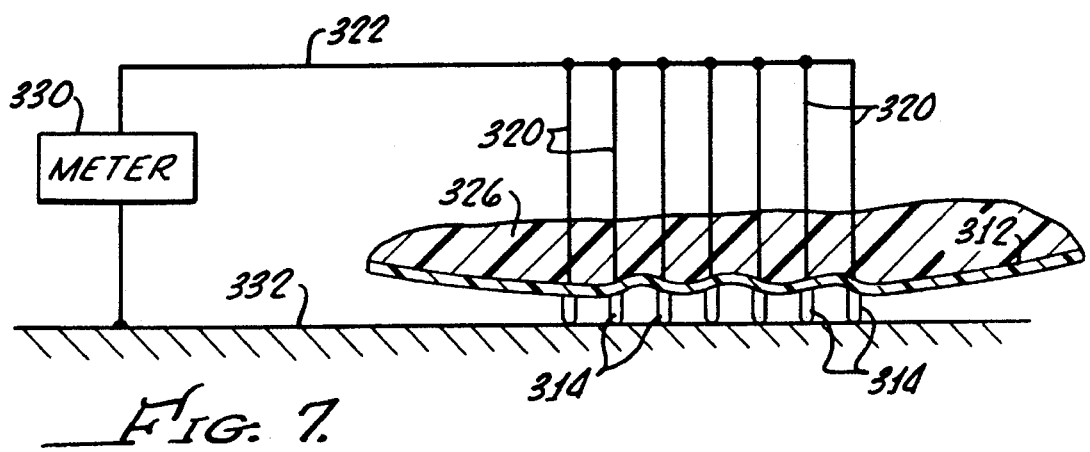
FIG. 7 schematically illustrates planarization of the tips of a plurality of membrane contacts of different lengths.

As is schematically illustrated in FIG. 7, an electric circuit is completed from each of probe contacts 314 through separate monitoring leads 320 to a meter 330, having its other side connected to the mandrel 360. The meter includes circuits (not shown) that are connected by plural lines 322 individually to different ones of the probe monitoring contacts so as to monitor completion of a separate electric circuit from the meter through the mandrel to each individual probe contact.

In operation of the planarizing mandrel illustrated in FIGS. 5, 6 and 7, the probe membrane is mounted in the fixture illustrated in FIG. 3, with a mandrel 360 mounted therein. Vacuum is applied to the vacuum chamber to form the membrane into an outwardly bowed curvature, and the mandrel is raised by rotation of adjustor disc 50 after the membrane and mandrel have been relatively rotationally aligned so that the membrane pads will all be received in the mating contact receiving recesses 313 of the mandrel. As the mandrel is raised the longest of the membrane contacts will first enter one of the mandrel recesses and contact the mandrel. The meter will signal that a circuit has been completed through this longest contact. The vacuum may be adjusted, that is, increased, until other contacts of the group of contacts of the membrane show, via the meter, that an electrical circuit has been completed between each of the respective contacts and the mandrel. Concomitantly, if desired, the mandrel itself may be raised by rotation of the adjustor disc 50 until all of the contacts of the membrane have made contact with the mandrel. The mandrel contact receiving recesses are precisely formed with precisely equal depths, so that the bottoms of each of the recesses precisely lie in a common plane. Therefore each of the membrane contacts now bottoms out against a bottom of one of the mandrel recesses and will also lie in a common plane when the meter 330 indicates that all electrical circuits have been completed. At this point, in an exaggerated view, the membrane 312 now has an irregular configuration, as can be seen in FIG. 7, whereas the outer ends of each of the contacts 314 are precisely co-planar, all lying on a common plane 332 that is defined by the bottoms of the recesses 313 of the mandrel. This irregular configuration is then fixed by casting the elastomer 326.

The described arrangement for predefining and maintaining a desired membrane shape is simple and inexpensive. It does not require a separate and individually shaped backup member for each different configuration of integrated circuit chip to be tested. Although the membrane has a permanent curved shape defined by the cast elastomer, both the membrane and elastomer are still flexible and resiliently deformable. In the present arrangement one needs only to route out the mandrel with its particular shape and recesses, which is a simple and inexpensive operation. With the contacts planarized and the membrane shaped to avoid drape, the membrane contacts may be made shorter. A shorter contact bump, one that projects by a smaller distance from the membrane, is preferred to ensure a proper wiping or scrubbing action. The wiping action is accomplished by a slight amount of horizontal motion as the integrated circuit pads move into contact with the flexible membrane contacts. The pre-shaped flexible membrane is deformed by its contact with the integrated circuit chip pads and thus the contact experiences a slight amount of horizontal motion relative to the chip pad. With a shorter bump this will provide a relative sliding action of the point of contact between the pad and the membrane contact, whereas with a longer bump the bump may bend or tilt without sliding across the chip pad. In such a case, without a relative sliding or wiping action, the high resistance aluminum oxide coating of the chip pad may not be broken, thus affording a greatly increased contact resistance. Further, planarized membrane contacts provide a more uniform contact resistance (between the membrane contacts and the chip pads) because they provide a more uniform scrubbing action on all of the contacts.

To position a chip for testing it is oriented by visual observation of chip pads and membrane contacts, through the transparent membrane, and the chip support table is raised until there is an initial contact. Thereafter, to ensure proper contact force on all chip pads, the chip is raised further by a small amount of "over travel" or "overdrive". Planarized contacts require less over-travel or over-drive during the upward motion of the chip into its test position.

A significant advantage of the preconfigured membrane and planarized short membrane contacts is the fact that a uniform scrubbing action is attained on all pads and provides a minimum of damage to chip pads while ensuring that all oxide coatings are penetrated. By decreasing the damage to chip pads and providing a decreased but effective scrubbing action, the circuit chip itself can be tested several times without danger of destruction of the chip pad. With prior needle type test probes so much damage may be done to a chip pad during each testing contact that in some cases only two tests are allowed for a given chip. With the present arrangement, on the other hand, five or more separate tests may be made without doing unacceptable damage to the chip pad.

Although the foregoing has been a description and illustration of specific embodiments of the invention, various modifications and changes thereto can be made by persons skilled in the art without departing from the scope and spirit of the invention as defined by the following claims.

What is claimed is:

1. A device for testing an electrical circuit element having contacts thereon in a predetermined pattern comprising:

a membrane support defining a membrane opening, a flexible membrane mounted to said membrane support and spanning said opening, said membrane having a plurality of contacts on one side thereof, said contacts being in a pattern corresponding in position to said predetermined pattern, circuit means on said membrane extending away from said contacts for connection to a test circuit, said membrane having a predetermined non-planar configuration, and a resilient form retaining body cast directly on the membrane and extending over and secured to the entire surface of the other side of said membrane and in contact therewith for holding said membrane in said predetermined non-planar configuration, said membrane configuration including an anti-drape recess between at least some of said membrane contacts, said anti-drape recess extending inwardly of the membrane away from said one side.

2. The device of claim 1 wherein said body comprises an elastomer cast-in-place upon the other side of said non-planar membrane, said elastomer being adhesively affixed to said membrane and permanently maintaining said membrane in said non-planar configuration.

3. The device of claim 2 including a transparent solid member secured to said membrane and in contact with a side of said elastomer that is remote from said membrane.

4. A pre-shaped membrane probe for testing integrated circuit chips comprising:

a substrate defining a membrane opening, and a pre-shaped membrane assembly mounted on said substrate and spanning said membrane opening, said membrane assembly comprising:

a thin flexible contact bearing membrane having a predetermined fixed non-planar configuration, and means for permanently maintaining said non-planar configuration of said membrane comprising a thin layer of elastomer cast-in-place upon, secured to and in direct contact with the entire area of one side of the membrane and extending over the entire area of said opening, said membrane having a plurality of contacts of mutually different lengths all having free ends lying in a common plane, said membrane in the area of said contacts having a permanent irregular configuration corresponding to the varying lengths of said contacts.

* * * * *